United States Patent
Hastings et al.

(10) Patent No.: US 7,157,898 B2
(45) Date of Patent: Jan. 2, 2007

(54) MAGNETIC FLUX CONCENTRATOR ANTI-DIFFERENTIAL CURRENT SENSING TOPOLOGY

(75) Inventors: Jerome K. Hastings, Sussex, WI (US); Mark A. Juds, New Berlin, WI (US); Mark G. Solveson, Oconomowoc, WI (US)

(73) Assignee: Eaton Corporation, Cleveland, OH (US)

( * ) Notice: Subject to any disclaimer, the term of this patent is extended or adjusted under 35 U.S.C. 154(b) by 27 days.

(21) Appl. No.: 10/711,743

(22) Filed: Oct. 1, 2004

(65) Prior Publication Data

US 2005/0073295 A1    Apr. 7, 2005

Related U.S. Application Data

(60) Provisional application No. 60/507,896, filed on Oct. 1, 2003.

(51) Int. Cl.
*G01R 33/00* (2006.01)
(52) U.S. Cl. .............................. 324/117 R; 324/117 H
(58) Field of Classification Search ..... 324/117 R–117 H, 126–127, 251–256; 338/32 R, 32 H
See application file for complete search history.

(56) References Cited

U.S. PATENT DOCUMENTS 4,464,625 A * 8/1984 Lienhard et al. ........ 324/117 R
5,041,780 A    8/1991 Rippel
5,241,263 A * 8/1993 Naoi et al. .............. 324/117 H

FOREIGN PATENT DOCUMENTS

| CA | 2 368 901 A1 | 10/2000 |
| DE | 298 18 370 U1 | 1/1999 |
| DE | 199 14 772 A1 | 10/2000 |
| DE | 100 23 837 A1 | 11/2001 |
| DE | 102 33 129 A1 | 2/2003 |
| EP | 0 538 658 A1 | 4/1993 |
| GB | 2 255 645 A | 11/1992 |

OTHER PUBLICATIONS www.redpointcontrols.com.
www.gmw.com.
www.excellontech.com.
www.lem.com.
www.sypris.com.
www.redpointcontrols.com (Date (Date Not Available).
www.gmw.com. (date not available).
www.excellontech.com (date not available).
www.lem.com (date not available).
www.sypris.com (date not available).

* cited by examiner

*Primary Examiner*—Vinh P. Nguyen
(74) *Attorney, Agent, or Firm*—Ziolkowski Patent Solutions Group, SC

(57) ABSTRACT

A system and method for current sensing includes a conductor configured to receive current flow therethrough and generate magnetic flux thereabout. The current sensor system also includes an anti-differential current sensor configured to monitor magnetic flux about the conductor and a flux concentrator configured to concentrate magnetic flux induced by current flow through the conductor.

30 Claims, 6 Drawing Sheets

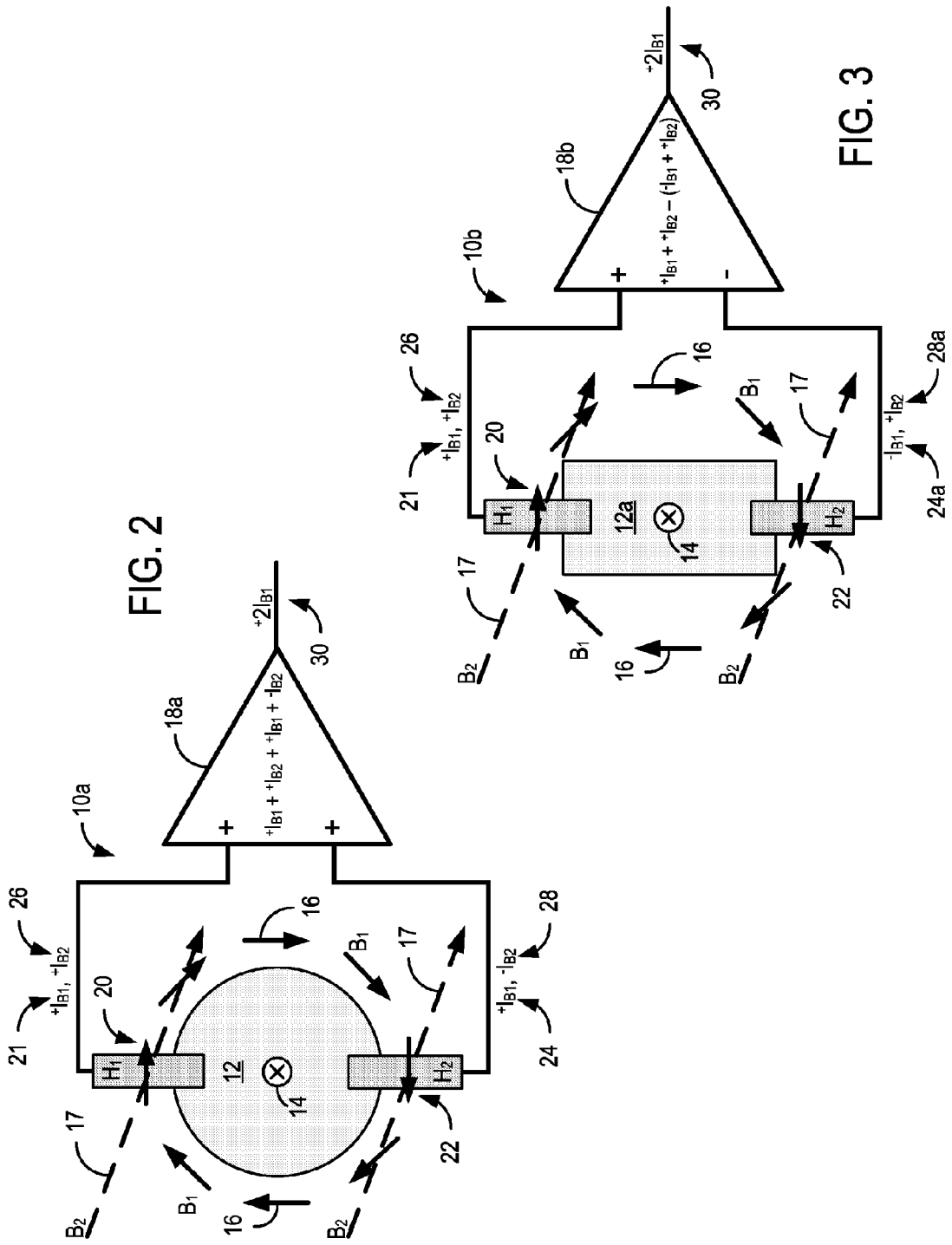

MAGNETIC FLUX CONCENTRATOR ANTI-DIFFERENTIAL CURRENT SENSING TOPOLOGY

CROSS-REFERENCE TO RELATED APPLICATION

This application claims the benefit of prior U.S. Provisional Application Ser. No. 60/507,896 filed Oct. 1, 2003 and entitled INTEGRATED, COMMUNICATING, NON-CONTACT CURRENT SENSOR AND ARC FAULT DETECTOR FOR BUS, CABLE AND FEED THROUGH INSTALLATIONS.

BACKGROUND OF THE INVENTION

The present invention relates generally to current measuring and monitoring, more particularly, to a system and method for concentrating and sensing concentrated magnetic flux associated with current flow through a conductor. A dual Hall sensor configuration is utilized in conjunction with a magnetic flux concentrating means to sense magnetic flux and provide feedback to a processing component. The processing component is arranged to generate an anti-differential output that is an algebraic sum or difference of the feedback received to remove feedback attributable to magnetic fields induced externally from the conductor.

Measuring and monitoring of current flow through a conductor is an important analysis that is performed in a wide variety of applications and circumstances. Current sensing designs often fall into one of two categories: contact topologies and non-contact topologies.

Contact sensors are common in many circumstances but include many inherent limitations. For example, while shunt-type sensors are readily applicable to direct current (DC) applications, shunt-type sensors are not suited to alternating current (AC) applications due to errors caused by induced loop voltages. On the other hand, while current transformers (CT) are suited for AC applications, such are inapplicable to DC applications due to the fundamental nature of transformers.

In any case, these contact-based sensor systems are typically large and may be difficult to employ, especially in areas where tight size constraints are necessary. Specifically, in order to deploy a contact-based sensor, such as a resistive shunt, it is necessary to remove the conductor from service. Additionally, shunt based sensors require lugs to form an electrical connection and a mounting means to secure the device in position. Similarly, CT-based sensors necessarily require adequate accommodations for a transformer.

Non-contact current sensing designs are often preferred in many applications because they reduce common mode noise typically experienced with direct contact designs, such as shunts. Non-contact designs also reduce heat buildups often associated with resistive shunts and the need to use burdened current transformers. Additionally, non-contact designs provide scalable outputs that are desirable for use with digital controllers.

A variety of designs and approaches have been developed for non-contact current monitoring systems. One common and desirable form of non-contact sensing and monitoring of current flow includes indirectly determining current flow through a conductor by detecting a magnetic field or flux induced as a result of the current flow through the conductor.

For example, metal core based systems are often used to measure the current flow through a conductor by detecting the magnetic flux induced by the current flow. The metal core is utilized to magnify the magnetic flux concentration and, thereby, provide increased accuracy in detecting the magnetic flux and the extrapolated current readings. Various topologies including "open-loop," "closed-loop," "flux gate," and "dithering" designs may be utilized, although all include limitations.

Open-loop sensors use the magnetic properties of the metal core material to magnify or concentrate the magnetic flux induced by the current flow through the conductor. However, to extrapolate the current measurements from the detected magnetic flux, these sensors rely on the "near linear" operational range of the metal core. A ferromagnetic core that enters a "saturation" operational range can distort the reported current compared to the actual current profile. Specifically, as saturation is reached, a current level that changes with time produces a time changing magnetizing force that produces a time changing magnetic flux density within the core. That is, as the core material approaches magnetic saturation, the "magnetic gain" declines and approaches the "magnetic gain" of air. As such, the magnetic field within the metal core is distorted in proportion to the difference in permeability at various points along a hysteresis loop of the metal core. Therefore, should the operating conditions lead to the saturation of the metal core, inaccurate current measurements may be gathered. Accordingly, sensing ranges of metal core sensors are typically hard-limited to the "near-linear" operational range.

Additionally, sensors relying on metal cores can experience hysteresis in the metal core that may produce a zero current offset error. Specifically, when at low or zero current levels, the metal core may act as a weak permanent magnet and report a persistent flux though little or no current is actually present. As such, zero offsets are particularly troublesome when monitoring DC power systems. As all permeable ferromagnetic materials exhibit some level of hysteresis, which produces an error at zero current, metal core sensors are susceptible to erroneous current measurements at low or no current levels. Furthermore, increased inductance can produce phase shifts between the actual current profile and the reported current profile.

Furthermore, while electronic-based sensors are typically limited by the voltage rails used in the sensor output stages, current sensors employing metal cores have an additional limitation imposed by the saturation point of the material. For example, a sensor with a scale factor of 1 volt per amp with a 5 volt rail will be limited to 5 amps regardless of the range of the detector. In metal core based sensors it is well known that the dynamic range is typically limited to 10:1.

Therefore, it is known that metal core current sensors include range, accuracy, and repeatability limits in proportion to the propensity for hysteresis, saturation, and non-linearity of the material used in the core.

"Closed-loop" sensors, flux gate approaches, and dithering approaches utilize a combination of electronic circuits and bucking coils to compensate for these material related errors and/or average-out errors. However, these systems merely diminish the effects of the errors, and do not entirely eliminate the potential for errors and incorrect current readings.

Accordingly, in order to eliminate the potential for inaccurate current measurements due to metal core saturation, hysteresis, or eddy currents, air-core sensors may be used to measure and monitor current. However, while the removal of the metal core eliminates the potential for inaccurate current measurements due to metal core saturation, hysteresis, or eddy currents, the air core does not have the magnetic flux magnifying or concentrating effect of metal cores. Therefore, air-core current sensors are readily susceptible to influence by external magnetic fields and may provide inaccurate current measurements. As such, air-core sensors are typically unsuitable for applications where multiple high external magnetic fields are present. As an overwhelming percentage of current sensors are required to be deployed in areas where numerous conductors and corresponding magnetic fields are in close proximity, air-core sensors are often undesirable.

It would therefore be desirable to design a system and method for current sensing that does not rely on ferromagnetic materials and is not susceptible to magnetic fields induced externally from the monitored conductor. That is, it would be desirable to have a system and method for—contact current sensing that does not include the inherent limitations of metal-core based current sensors while providing accurate current feedback in the presence of external magnetic fields. Furthermore, it would be desirable to have a system and method for concentrating magnetic flux associated with a particular conductor to increase monitoring accuracy.

BRIEF DESCRIPTION OF THE INVENTION

The present invention is directed to a system and method that overcomes the aforementioned drawbacks. Specifically, an anti-differential, error correcting, sensor topology is utilized in conjunction with a magnetic flux concentrating means that eliminates the need for ferromagnetic concentrators. As such, the sensor eliminates the limitations associated with metal-core based current sensors and is capable of providing accurate current monitoring in the presence of external magnetic fields.

In accordance with one aspect of the invention, a current sensing system is disclosed that includes a conductor configured to receive current flow therethrough and generate magnetic flux thereabout and an anti-differential current sensor configured to monitor magnetic flux about the conductor. A flux concentrator is configured to concentrate magnetic flux induced by current flow through the conductor.

According to another aspect of the invention, a current sensor is disclosed that includes at least one spiraled conductive path configured to receive a current flow therethrough and concentrate magnetic flux induced by the current flow through the at least one spiraled conductive path. At least one Hall effect sensor is positioned proximate to the at least one spiraled conductive path and configured to sense the concentrated magnetic flux and provide a signal indication of the current flow through the at least one spiraled conductive path.

In accordance with another aspect, the invention includes a current sensor system. The current sensor system includes a conductor configured to receive a current flow and an anti-differential current sensor configured to monitor the current flow through the conductor. At least one flux concentrating recess is configured to receive the anti-differential current sensor.

In accordance with yet another aspect of the invention, a method of making a flux concentrating current sensor system is disclosed that includes configuring a conductive path to form a flux concentrating means to concentrate magnetic fields and disposing a pair of ferromagnetic-free current sensors in proximity to the flux concentrating means to detect the concentrated magnetic fields. The method also includes configuring an anti-differential calculator to receive feedback from the pair of ferromagnetic-free current sensors and generate an indication of current flow through the conductive path that is substantially free of errors due to magnetic fields generated externally from the conductive path impinging upon the pair ferromagnetic-free current sensors.

Various other features and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings:

FIG. 2 is a schematic of one embodiment of the anti-differential current sensor configuration of FIG. 1 in accordance with the present invention.

FIG. 3 is a schematic of another embodiment of the anti-differential current sensor configuration of FIG. 1 in accordance with the present invention.

DETAILED DESCRIPTION OF THE PREFERRED EMBODIMENT

The present invention is related to a system and method for anti-differential, error-correcting current sensing. A plurality of magnetic flux sensors is arranged about a conductor and provides feedback to a processing component or device configured to generate an output with reduced feedback induced by magnetic fields external to the conductor. Various flux concentrator topologies may be utilized with the anti-differential current sensor to concentrate the magnetic flux received by the plurality of magnetic flux sensors. The system may be disposed in a variety of configurations designed for optimal disposition of the plurality of magnetic flux sensors about a given conductor type. Some examples of possible configurations include etched spiral path topologies for low current and printed circuit board current sensing, dual-spiral and spiral-helix topologies for contact based current sensing, and wire and bus bar mount topologies for wire and bus bar conductors. Furthermore, the system may be integrated with additional systems that utilize current sensing as well as communication interfaces.

Figure 1:
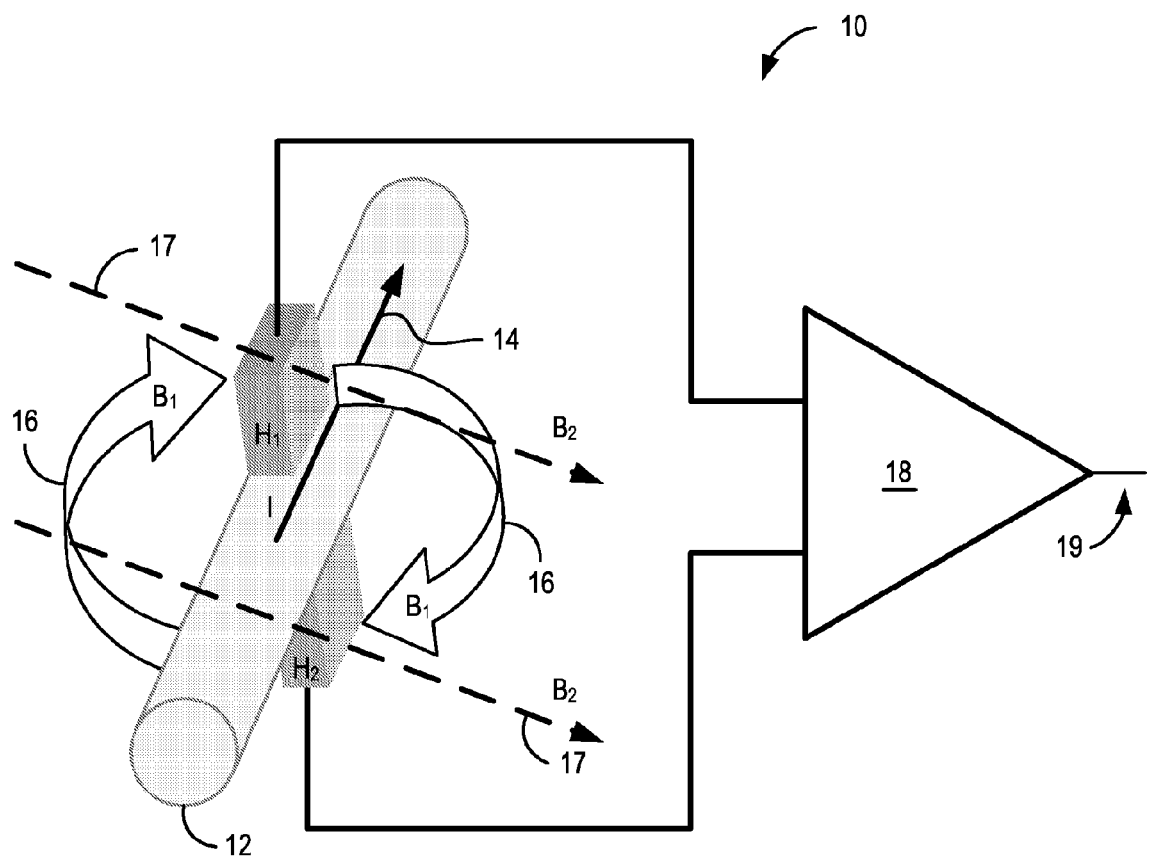
FIG. 1 is a perspective diagram of an anti-differential current sensor configuration in accordance with the present invention.

Referring to FIG. 1, a perspective view is shown of an anti-differential current sensor configuration 10 arranged about a conductor 12 in accordance with the present invention. The conductor 12 is illustrated as a round wire for exemplary purposes only but, as will be described, may include any form of current conductor including bus bars, integrated circuits, printed circuit boards, circuit breakers, and the like. The conductor includes a current flow therethrough, as illustrated by an arrow 14 and labeled "I." As is well known, the current flow 14 through the conductor 12 induces a magnetic field, as illustrated by arrows 16, labeled "$B_1$." Two magnetic flux sensors $H_1$, $H_2$, preferably Hall effect sensors, are disposed on substantially opposite sides of the conductor 12. The positioning of the Hall effect sensors $H_1$, $H_2$ on substantially opposite sides of the conductor 12 aids in reducing the effects of externally induced magnetic fields, labeled $B_2$ and illustrated by arrows 17, that can otherwise cause inaccurate readings of the current 14 through the conductor 12. That is, the two current sensors $H_1$, $H_2$ are used in a configuration that reports the current inside the conductor 12 to a processing component 18 that is configured to calculate a sum or summed difference of the feedback from the two current sensors $H_1$, $H_2$ to generate an anti-differential output having reduced influences from externally induced magnetic fields $B_2$ 17. Specifically, the anti-differential current sensor configuration 10 provides an anti-differential output 19 that is a highly accurate indication of the current flow 14 through the conductor 12 and is substantially free of influence from externally induced magnetic fields $B_2$ 17.

The anti-differential current sensor configuration 10 may include various architectures or configurations of the current sensors $H_1$, $H_2$ and processing component 18. Referring now to FIG. 2, a first configuration of the anti-differential current sensor configuration 10a is shown. The conductor 12 is again shown with opposing Hall effect sensors $H_1$, $H_2$ disposed about a periphery of the conductor 12. FIG. 2 illustrates the conductor 12 in the form of a wire. However, it is contemplated that the conductor may be of various forms. Therefore, FIG. 2 shows the conductor 12 as a wire conductor while FIG. 3 shows a conductor 12a in the form of a bus bar. Additionally, it is contemplated that the Hall effect sensors $H_1$, $H_2$ may not only be disposed about the periphery of the conductor 12 but may be disposed within flux concentrating recesses within the conductor 12 to improve the magnetic flux detected by the Hall effect sensors $H_1$, $H_2$.

The current flow 14 through the conductor 12 is again represented as "I" and the associated magnetic field, which circles the conductor, is represented as "$B_1$," 16. According to the first configuration of the anti-differential current sensor configuration 10a, the Hall effect sensors $H_1$, $H_2$ are not only disposed on opposite sides of the conductor 12 but are also configured to provide feedback of positively designated current flow upon detecting oppositely directed magnetic flux. That is, Hall effect sensor $H_1$ provides feedback indicating that a positive current value of magnitude "I" has been determined upon detecting a directional magnetic flux in a first direction 20. Therefore, the feedback generated by Hall effect sensor $H_1$ upon detecting directional magnetic flux $B_1$ 16 in the first direction 20 is represented as "$^+I_{B1}$," 21.

On the other hand, according to the first configuration of the anti-differential current sensor 10a, Hall effect sensor $H_2$ is configured to provide feedback indicating that a positively designated current flow has been determined upon detecting a directional magnetic flux in a second direction 22. Therefore, the feedback generated by Hall effect sensor $H_2$ upon detecting directional magnetic flux $B_1$ 16 in the second direction 22 is also represented as "$^+I_{B1}$," 24. Accordingly, even though the directions 20, 22 of the magnetic flux $B_1$ 16 are substantially opposite in direction when detected by Hall effect sensor $H_1$ as opposed to Hall effect sensor $H_2$, both Hall effect sensors $H_1$, $H_2$ provide positive feedback "$^+I_{B1}$," 21, 24.

Following this convention, upon detecting a stray or foreign magnetic field $B_2$ 17 that is induced or generated externally to the conductor 12 and generally impinges upon each Hall effect sensor $H_1$, $H_2$ substantially equally, the Hall effect sensors $H_1$, $H_2$ provide substantially equal and opposite feedback. Specifically, unlike the magnetic field $B_1$ 16 induced by the current flow 14 through the conductor 12, which uniformly encircles the conductor 12, the externally induced magnetic field $B_2$ 17 is generally directionally uniform with respect to impinging upon the Hall effect sensors $H_1$, $H_2$. Accordingly, due to the directional configuration of the Hall effect sensors $H_1$, $H_2$, Hall effect sensor $H_1$ will provide feedback indicating a positive current flow upon detecting the magnetic field $B_2$, while Hall effect sensor $H_2$ will provide feedback indicating a negative current flow upon detecting the magnetic field $B_2$ 17. That is, Hall effect sensor $H_1$ will provide positive feedback "$^+I_{B2}$," 26 while Hall effect sensor $H_2$ will provide negative feedback "$^-I_{B2}$," 28.

All feedback, $^+I_{B1}$, $^+I_{B2}$, $^+I_{B1}$, and $^-I_{B2}$ is then passed to a processing component 18a. According to the first configuration of the anti-differential current sensor 10a, the processing component 18a is a summing amplifier, such as a summing operational amplifier (op amp), configured to provide an algebraically summed anti-differential output. However, while the processing component 18a is illustrated as a summing op amp, it is contemplated that a wide variety of processing components may be utilized. Specifically, any processing component, whether analog or digital, that is capable of generating an anti-differential sum of feedback received may be utilized within the anti-differential current sensor configuration 10a. Therefore, the term "processing component" as utilized herein is defined to include any analog, digital, or discrete components that may be configured to generate an algebraic sum of inputs.

Therefore, the processing component 18a receives all feedback from the Hall sensors $H_1$, $H_2$ and provides a sum of $^+I_{B1}+^+I_{B1}+^+I_{B2}+-I_{B2}$. As such, the feedback generated in response to the externally induced magnetic flux $B_2$ 17 ($^+I_{B2}$, $^-I_{B2}$) cancel and the anti-differential output 30 of the processing component 18a is generally twice the current flow 14 through the conductor 12, as determined from the magnetic field $B_1$. Therefore, regardless of the strength, direction, or concentration of extraneous magnetic fields $B_2$ 17, the output 30 of the processing component 18a is $^+2I_{B1}$. The first configuration of the anti-differential current sensor configuration 10a thereby yields accurate current measurements by reducing, if not essentially removing, feedback associated with stray magnetic fields $B_2$ 17 induced or generated externally to the conductor 12 from which current feedback is desired.

Referring now to FIG. 3, a second configuration of the anti-differential current sensor configuration 10b is shown. For exemplary purposes, FIG. 3 illustrates a conductor 12a, this time in the form of a bus bar. Again, it is contemplated that the Hall effect sensors $H_1$, $H_2$ may not only be disposed about the periphery of the conductor 12a but may be disposed within flux concentrating recesses within the conductor 12a to improve the magnetic flux detected by the Hall effect sensors $H_1$, $H_2$.

As will be described in detail below, the second configuration of the anti-differential current sensor 10b differs from the first configuration of the anti-differential current sensor 10b shown in FIG. 2 by the architecture or configuration of the Hall effect sensors $H_1$, $H_2$ and the configuration of the processing component 18b. Specifically, due to the configuration of the Hall effect sensors $H_1$, $H_2$ about the conductor 12a, the processing component 18b is configured as a differential or "differencing" amplifier.

In accordance with one embodiment, the differential amplifier is a differential op amp, configured to calculate an algebraically summed difference of the feedback received to generate an anti-differential output. However, while the processing component 18b is illustrated as a differential op amp, it is equally contemplated that a wide variety of processing components may be utilized. Specifically, any processing component, whether analog or digital, that is capable of calculating a summed difference of feedback received to generate the desired anti-differential output may be utilized within the anti-differential current sensor configuration 10b. Therefore, the term "processing component" as utilized herein is again defined to include any analog, digital, or discrete components that may be configured to generate an algebraic sum of feedback received.

According to the second configuration of the anti-differential current sensor 10b, the Hall effect sensors $H_1$, $H_2$ are disposed on opposite sides of the conductor 12a and are configured to provide equal and oppositely designated feedback of the current flow 14 through the conductor 12a upon detecting oppositely directed magnetic flux 20, 22. That is, Hall effect sensor $H_1$ provides feedback indicating that a positive current value of magnitude "I" has been determined upon detecting a directional magnetic flux in a first direction 20. Therefore, the feedback generated by Hall effect sensor $H_1$ upon detecting directional magnetic flux $B_1$ 16 in the first direction 20 is represented as "$^+I_{B1}$," 21.

On the other hand, according to the second configuration of the anti-differential current sensor 10b, Hall effect sensor $H_2$ is configured to provide feedback indicating that a negatively designated current flow has been determined upon detecting a directional magnetic flux in a second direction 22. Therefore, the feedback generated by Hall effect sensor $H_2$ upon detecting directional magnetic flux $B_1$ 16 in the second direction 22 is represented as "$^-I_{B1}$," 24a. Accordingly, since the directions 20, 22 of the magnetic flux $B_1$ 16 are substantially opposite when detected by Hall effect sensor $H_1$ as opposed to Hall effect sensor $H_2$, Hall effect sensors $H_1$, $H_2$ provide substantially equal feedback that is directionally opposite "$^+I_{B1}$" 21 and "$^-I_{B1}$" 24a respectively. That is, the feedbacks 21, 24a are substantially equal in magnitude but each has opposite polarity.

Following this convention, upon detecting another magnetic field $B_2$ 17 that is induced or generated externally to the conductor 12a and generally impinges upon each Hall effect sensor $H_1$, $H_2$ substantially equally, the Hall effect sensors $H_1$, $H_2$ provide substantially equal feedback. Specifically, due to the directional configuration of the Hall effect sensors $H_1$, $H_2$, Hall effect sensors $H_1$, $H_2$ will both provide positive feedback 26, 28a, represented as "$^+I_{B2}$," upon detecting the magnetic field $B_2$. Even slight variations in the strength of the stray magnetic fields result in little error inducement because of the relative strength of the stray fields as compared to that of the sensed conductor.

All feedback, $^+I_{B1}$, $^-I_{B1}$, $^+I_{B2}$, and $^+I_{B2}$ is then passed to the processing component 18b. As previously described, according to the second configuration of the anti-differential current sensor 10b, the processing component 18b is configured in a differential configuration to generate the desired anti-differential output eliminating feedback generated upon detecting the externally induced magnetic field $B_2$. That is, the processing component receives the feedback $^+I_{B1}$, $^-I_{B1}$, $^+I_{B2}$, and $^+I_{B2}$ and algebraically calculates a summed difference. Specifically, a summed difference is generated as $(^+I_{B1}+^+I_{B2})-(^-I_{B1}+^+I_{B2})$ yielding $^+2I_{B1}$, 30.

Therefore, through the second configuration of the anti-differential current sensor 10b includes a different configuration of the Hall effect sensors $H_1$, $H_2$ and the differential amplifier 18b rather than the summing amplifier 18a of FIG. 2, both the first configuration of the anti-differential current sensor 10a and the second configuration of the anti-differential current sensor 10b yield the same anti-differential output 30 that effectively excludes influence from externally induced magnetic fields 17. As such, both the first configuration of the anti-differential current sensor 10a and the second configuration of the anti-differential current sensor 10b provide highly accurate current measurements by reducing, if not essentially removing, feedback associated with stray magnetic fields induced or generated externally to the conductor 12a from which current feedback is desired.

Figure 4:
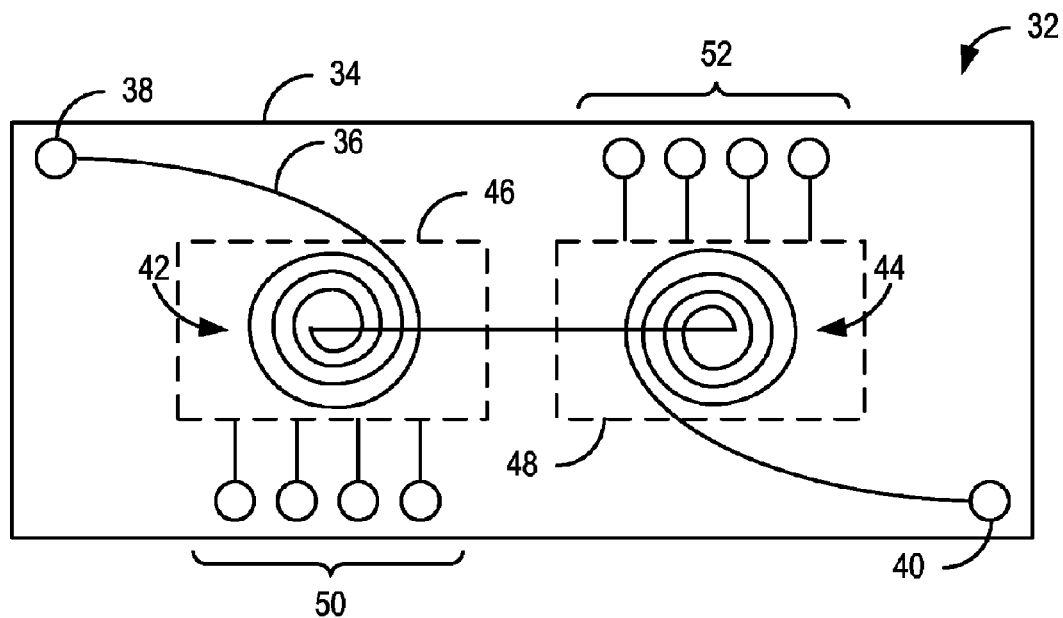
FIG. 4 is a plan diagram of a current sensor configuration and flux concentrator in accordance with one embodiment of the present invention.

Referring now to FIG. 4, another current sensing and flux concentrator system 32 is shown for determining current flow through a conductor. The current sensing system 32 is particularly suited for accurately detecting relatively low currents such as are often found on conductors within printed circuit (PC) boards. Specifically, the system 32 preferably includes a PC board 34 with a conductive path that comprises an etching 36, that as will be described, forms a flux concentrator. In accordance with a one embodiment, the PC board 34 may include an input terminal 38 and output terminal 40 to allow the current sensing system 32 to be enclosed in a housing, as will be described, or to exist as an autonomous system.

The conductive path or etching 36 includes a first spiraled portion 42 and a second spiraled portion 44. As will be described, the first spiraled portion 42 and the second spiraled portion 44 act as a magnetic flux concentrator. As illustrated, the first spiraled portion 42 and the second spiraled portion 44 are spiraled in opposite directions. Disposed on the side of the board 34 opposite the etching 36 are a first Hall effect sensor 46 and a second Hall effect sensor 48, shown in phantom. As previously described with respect to FIGS. 2 and 3, the Hall effect sensors 46, 48 may be configured in a variety of architectures within the anti-differential topology.

Figure 5:
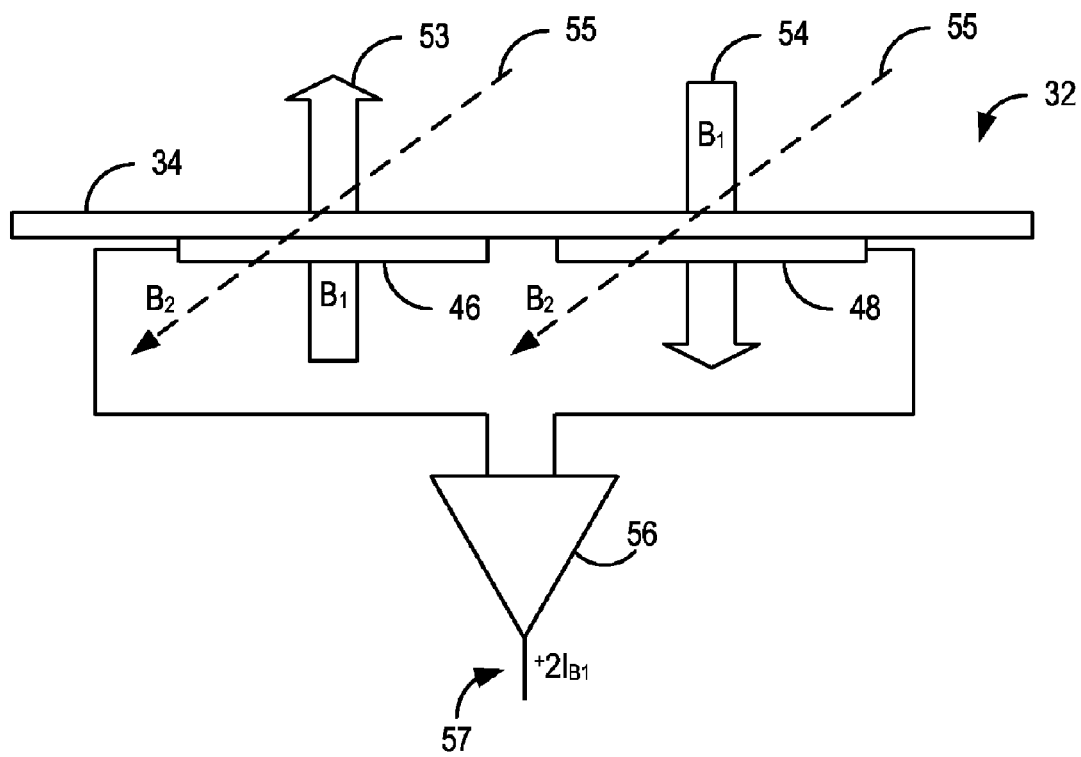
FIG. 5 is a side view of the current monitoring system and flux concentrator of FIG. 4 in accordance with the present invention.

Referring now to FIG. 5, a side view of the current sensing and flux concentrating system 32 of FIG. 4 is shown. Specifically, the PC board 34 is shown from a side view whereby profiles of the Hall effect sensors 46, 48 are shown mounted to the bottom of the PC board 34. The function of the spiraled magnetic flux concentrator will now be described. The spiraled conductive paths 42, 44 of FIG. 4 etched in the PC board 34 concentrate opposing directional magnetic fields $B_1$ 53, 54. That is, as shown in FIG. 5, a first magnetic field $B_1$ 53 is induced and concentrated in a first direction from the PC board 34 and a second magnetic field $B_1$ 54 is induced and concentrated in a second, opposite direction from the PC board 34. Specifically, by winding the current flow from the conductive path through the tightly spiraled conductive paths 42, 44 the induced magnetic fields $B_1$ 53, 54 are concentrated within a relatively small area. As such, magnetic flux concentration is achieved without the need for ferromagnetic flux concentrators.

Depending on the architecture and/or positioning of the Hall effect sensors 46, 48, the Hall effect sensors 46, 48 are configured to either both provide directionally similar feedback upon detecting the respective concentrated magnetic fields $B_1$ 53, 54 or provide equal and opposite feedback upon detecting the respective concentrated magnetic fields $B_1$ 53, 54, in accordance with that described with reference to FIGS. 2 and 3.

As such, regardless of the configuration of the Hall effect sensors 46, 48, feedback generated upon detecting a stray or errant magnetic field $B_2$ 55 induced externally to the conductive path etched on the PC board 34 is effectively cancelled out upon receiving the feedback at a processing component and algebraically calculating an anti-differential output 57. That is, as described with respect to FIGS. 2 and 3, depending on the configuration of the Hall effect sensors 46, 48, the processing component 56 may be configured in a summing architecture or a differentiating architecture so that the feedback generated upon detecting the externally generated magnetic field $B_2$ 55 is substantially removed when generating the anti-differential output 57. Accordingly, a highly accurate measurement of even relatively low current flow through the etched conductive paths of the PC board 34 is generated by the current sensing system 32. That is, by concentrating the magnetic fields $B_1$ 53, 54 that are monitored and by removing feedback induced by stray magnetic fields $B_2$ 55, relatively low current flows through the etched conductive path 36 can be detected with a high degree of accuracy.

These highly accurate based current measurements of the above-described current sensor configurations allow the current sensor configuration to operate in environments having various external magnetic fields without degrading current measurements for a specific conductor. However, the accuracy of the current sensor in detecting a particular magnetic field associated with a particular conductor can be improved if the current sensor is configured, for example, for the particular conductor configuration and current level being monitored. Additionally, by disposing the sensors in close proximity to the monitored conductor or within current concentrating recesses, accuracy can be improved.

Figure 6:
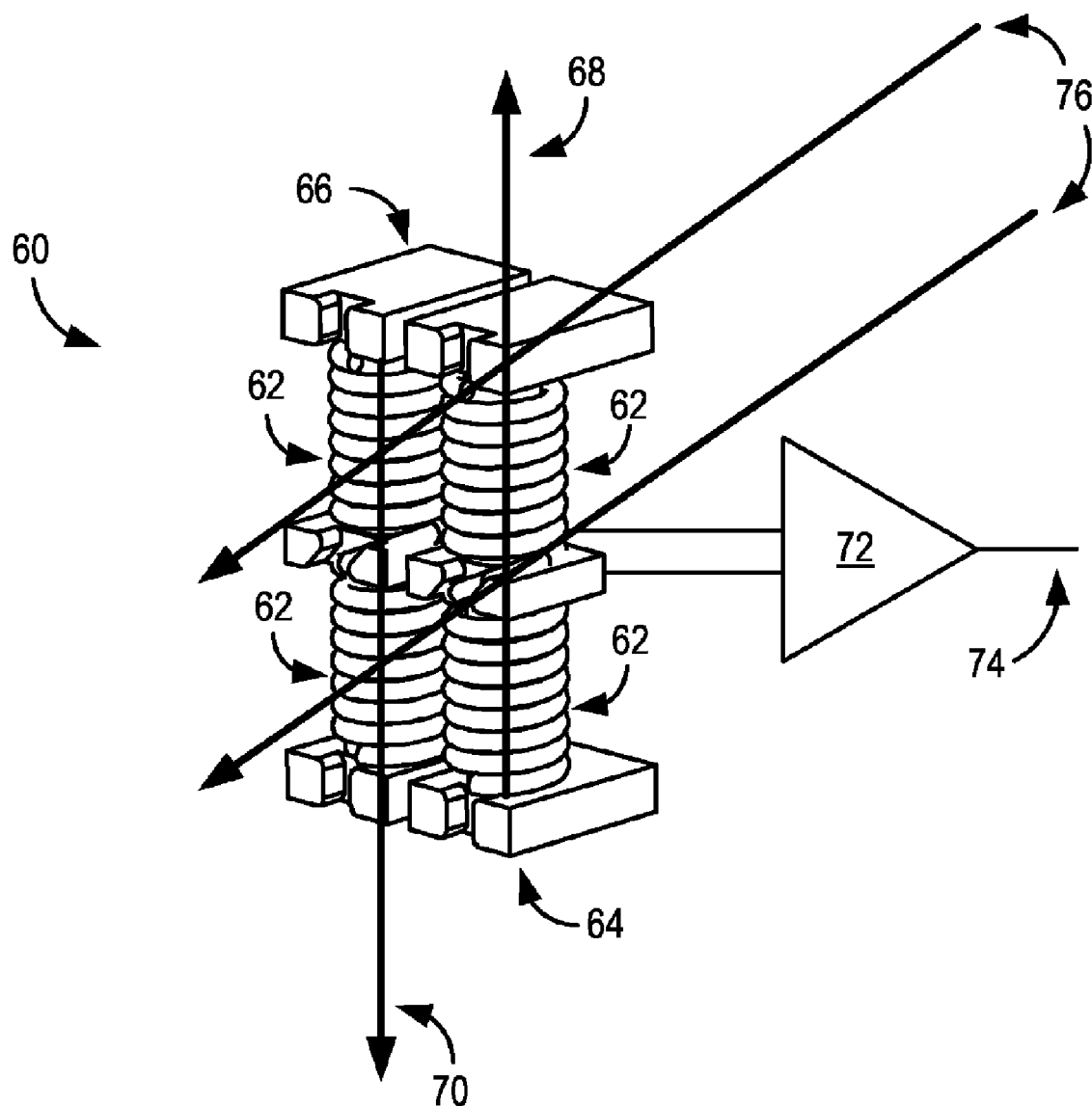
FIG. 6 is a perspective view of another flux concentrator for a current sensor configuration in accordance with another embodiment of the present invention

Referring now to FIG. 6, another magnetic flux concentrator configuration 60 is shown. Specifically, the flux concentrator 60 is formed by a plurality of conductive wire spirals 62. The conductive wire spirals 62 form a quad-helix concentrator that concentrates magnetic flux induced by current flow through the conductive wire spirals 62. Specifically, the conductive wire spirals 62 include two opposingly spiraled conductive paths 64, 66. As current flows through one conductive path 64 of the flux concentrator 60, a first magnetic flux is concentrated in a first direction 68. Furthermore, as current flows through the other conductive path 66 of the flux concentrator 60, a second magnetic flux is concentrated in a second direction 70.

A first Hall effect sensor (not shown) is disposed within one spiraled conductive path 64 and a second Hall effect sensor (not shown) is disposed with the other spiraled conductive path 66. As described with respect to FIGS. 2–5, the Hall effect sensors along with a processing component 72 are configured according to an anti-differential topology to provide feedback to the processing component 72 to calculate an anti-differential output 74. Again, the anti-differential output 74 is substantially free of feedback attributable to magnetic fields 76 induced externally from the flux concentrator 60. By concentrating the magnetic fields 68, 70 induced by current flow through the spiraled conductive paths 64, 66, the affects of stray magnetic fields 76 are reduced and improved current sensing of even relatively low current flow through the flux concentrator 60 is achieved.

Further advantages are gained by matching the Hall effect sensors. That is, if properly matched, the system is substantially free of errors due to zero flux offsets and Hall effect gain differences. Furthermore, matching the Hall effect sensors substantially corrects zero flux offset drift associated with temperature fluctuations. However, for a configuration utilizing a single Hall effect sensor, it is contemplated that active electronic correction may be utilized to offset zero flux offset drift associated with temperature fluctuations. Furthermore, a constant current power supply may be utilized having a bias current compensation circuit or a temperature dependent adjustable gain to compensate for Hall gain drift. Additionally or alternatively, the processing component includes a temperature dependant op-amp gain loop configured to compensate for temperature dependent electronic drift. Also, Lorentz force drifts associated with temperature variations can be corrected using by the temperature dependent supply to power the anti-differential current sensor.

Figure 7:
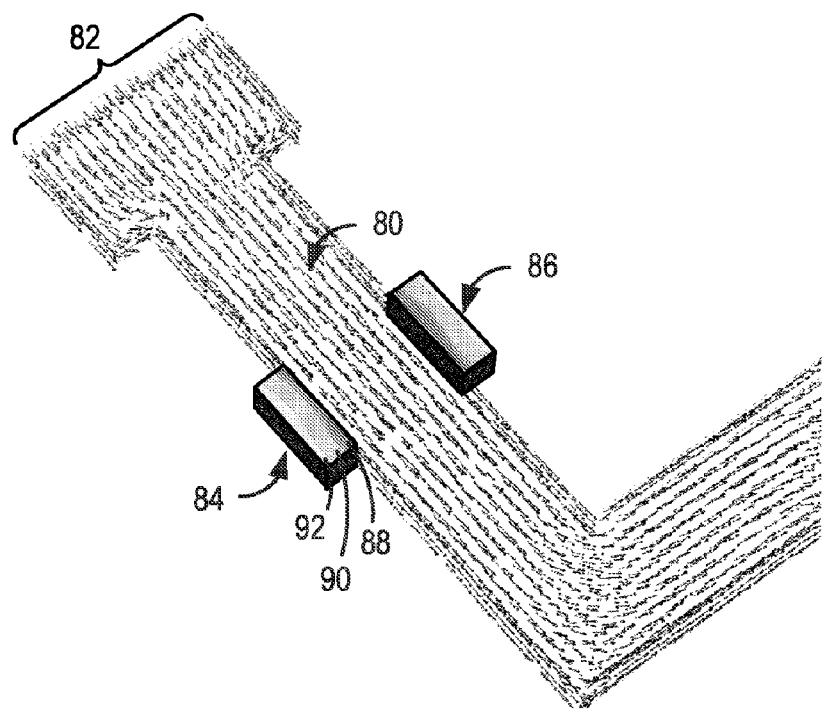
FIG. 7 is an illustration of induced magnetic field strength associated with a given current flow through a conductor in accordance with anther embodiment of the present invention.
Figure 8:
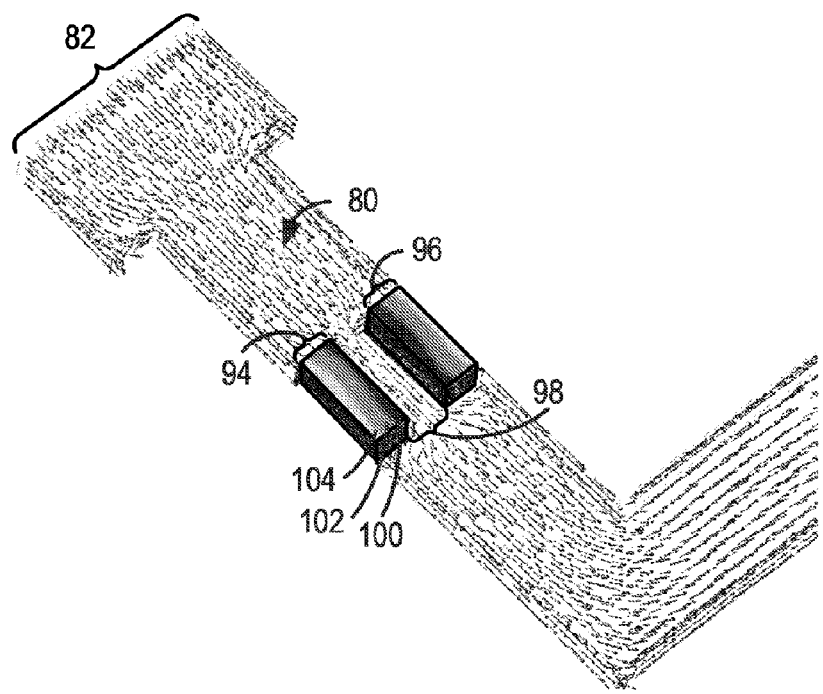
FIG. 8 is an illustration of induced and concentrated magnetic field strength associated with a given current flow through a conductor, in accordance with another embodiment of the present invention.

Referring now to FIG. 7, a conductor 80 in the form of a bus bar is shown with a current 82 flowing therethrough. FIGS. 7 and 8 illustrate a conductor in the form of a bus bar. However, it is recognized that any shape or form of conductor is equivalently applicable.

Opposing peripheral areas 84, 86 are highlighted where, as previously described, Hall effect sensors may be disposed to achieve an optimal current sensing configuration. The opposing peripheral areas 84, 86 include magnetic flux bands 88–92 illustrating magnetic flux levels that decrease with increased distance from the bus bar 80. That is, dark shaded areas represent high magnetic flux concentrations while the light shaded areas illustrate lower magnetic flux concentrations. Therefore, the darkest band 88 indicates the highest region of magnetic flux concentration while the lightest band 92 indicates a significantly lower magnetic flux concentration. Accordingly, should a Hall effect sensor that is disposed at peripheral area 84 be located in magnetic flux band 88, sufficient magnetic flux may be detected to ensure accurate current measurements when in close proximity to adjacent bus bars. On the other hand, should a Hall effect sensor that is disposed at peripheral area 84 be located in magnetic flux band 92, sufficient magnetic flux may not be detected to ensure accurate current measurements when in proximity to adjacent bus bars and associated magnetic flux. Therefore, it is advantageous that a Hall effect sensor configuration be disposed as closely to the conductor 80 as possible in order to ensure accurate current sensing and less the affects of interference from externally induced magnetic fields.

The accuracy of current sensing can be further improved using geometric recesses configured to concentrate the magnetic flux induced by the current flow 82 through the conductor 80. Specifically, referring to FIG. 8, opposing notches 94, 96 have been cut into the bus bar 80 forming a flux concentrator. As such, the current 82 flowing through the bus bar 80 is forced into a narrowed conductive path 98 of the bus bar 80. By concentrating the current flow 82 through the narrowed conductive path 98, the magnetic flux induced as the current flow 82 passes through the narrowed conductive path 98 is concentrated. That is, as illustrated by the increased intensity of the magnetic flux bands 100–104, when compared to the magnetic flux band 88–92 of FIG. 7, the opposing notches 94, 96 serve to concentrate the magnetic flux induced by the current flow 82 through the narrowed conductive path 98.

Figure 9:
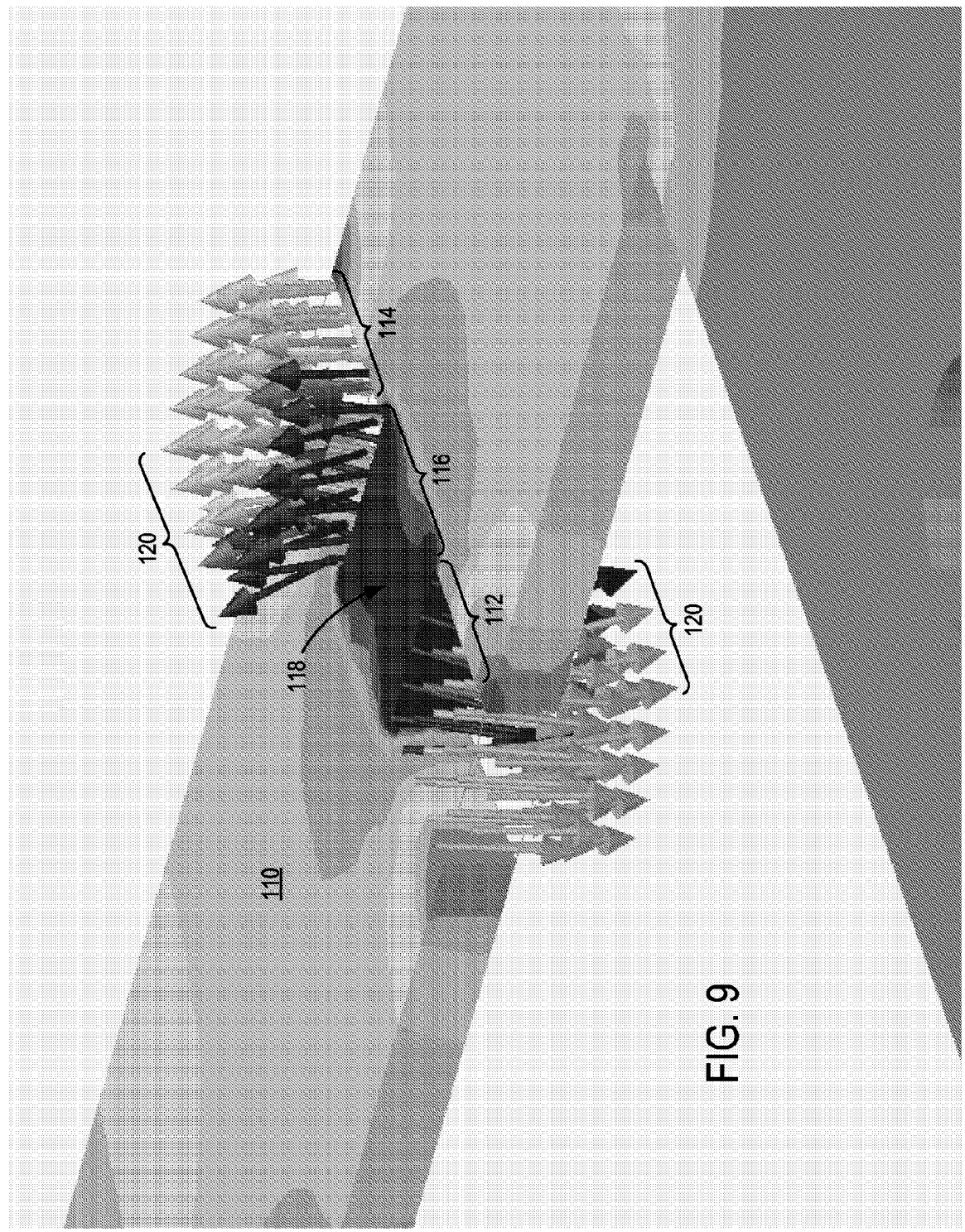
FIG. 9 is a perspective illustration of a concentrated magnetic field strength in accordance with that shown in FIG. 8.

This magnification is further illustrated in FIG. 9, which shows a perspective view of a bus bar 110 and a three-dimensional representation of the magnetic field induced by current flow through the bus bar 110. Again, the bus bar 110 includes opposing notches 112,114 configured to concentrate magnetic flux. By forcing the current flow through the narrowed conductive path 116, current flow is concentrated, as illustrated by the darkened area 118 causing the concentrated directional magnetic fields 120 representing high magnetic flux densities. Therefore, by disposing a Hall effect sensor configuration within the opposing notches 112,114, the magnetic flux density detected by the Hall effect sensor configuration is greatly increased over a Hall effect sensor configuration disposed about an external periphery of the bus bar 110. As such, the effects of interacting magnetic flux associated with adjacent conductors are reduced and increased current sensing accuracy is achieved. Furthermore, by magnifying the magnetic flux induced by a given current flow through a conductor, lower current levels are more accurately detectable.

It is contemplated that magnetic flux concentration through geometric augmentation may be readily extended to other configurations of conductors beyond those exemplary configurations describe above. For example, by notching opposing portions of a circular wire conductor to create a trough allows placement of Hall effect sensors therein. As such, similar magnetic flux concentration, as described with respect to a bus bar in FIGS. 7–9, may be achieved in wire conductors providing increased measurement accuracy and enabling more precise current sensing of lower currents. Therefore, it is contemplated that geometric-based magnetic flux concentrators and current density modification geometries, such as achieved through "notching" or "troughing" techniques, may be extended to virtually any size or shape conductor to increase measurement accuracy and enable precise current sensing of low currents levels.

That is, it is contemplated that a flux concentrator may be of various forms. Specifically, a flux concentrator may include a narrowed passage through a conductor, a notch or recess within a conductor, a spiraled etching conductor, a spiraled wire conductor, and other flux concentrator configurations that are free of ferromagnetic materials. It is contemplated that any one of these flux concentrator configurations may be utilized for a specific application.

Additionally, while the above-described system is described with respect to utilizing a pair of Hall effect sensors within the anti-differential topology, it is contemplated that alternative magnetic flux sensors may be equivalently utilized. Specifically, magnetoresistive structures (MRS), giant magnetoresistive structures (GMRS), and the like may be equivalently utilized within the anti-differential topology.

The present invention yields error correcting for externally induced magnetic fields for current sensing and monitoring of both AC and DC power sources. The anti-differential output generated is of high fidelity due to the absence of magnetic core materials. Low inductance, achieved as a function of an air core configuration, allows the current sensor configuration to be highly responsive to change as well as provides in-phase, real-time, current feedback vectors. The sensor configuration includes wide and dynamic range abilities due to the absence of permeable materials and the absence of a saturation point.

Additionally, the absence of non-linear saturating or ferromagnetic core materials eliminates DC error offsets associated with hysteresis of ferromagnetic materials and allows the current sensor configuration to be utilized to monitor AC and DC circuits. Therefore, the system generates an anti-differential output that is substantially free of variations due to hysteresis, magnetic core saturation, and eddy currents because the system is substantially free of ferromagnetic field concentrating materials. Furthermore, the elimination of metallic core materials reduces the overall size of the current sensor configuration and lowers consumed power. The sensor configuration is flexibly deployable to conductors including current flows from a few milli-amps to a few thousand amps.

By matching the Hall effect sensors, the system is substantially free of errors due to zero flux offsets and Hall effect gain differences. Furthermore, matching the Hall effect sensors substantially corrects any zero flux offset drift associated with temperature fluctuations. Furthermore, a constant current power supply may be utilized having a bias current compensation circuit or a temperature dependent adjustable gain to compensate for Hall gain drift. Additionally or alternatively, the processing component includes a temperature dependant op-amp gain loop configured to compensate for temperature dependent electronic drift. Also, Lorentz force drifts associated with temperature variations can be corrected using by the temperature dependent supply to power the anti-differential current sensor.

While the above-described technique has been described with respect to current monitoring systems, it is equivalently applicable for voltage and/or power monitoring systems. That is, it is contemplated that additional systems and subsystems may be utilized with the above described techniques and topologies to equivalently generate highly accurate voltage and/or power measurements.

Therefore, the present invention includes a current sensing system having a conductor configured to receive current flow therethrough and generate magnetic flux thereabout and an anti-differential current sensor configured to monitor magnetic flux about the conductor. A flux concentrator is configured to concentrate magnetic flux induced by current flow through the conductor.

In another embodiment of the present invention, a current sensor includes at least one spiraled conductive path configured to receive a current flow therethrough and concentrate magnetic flux induced by the current flow through the at least one spiraled conductive path. At least one Hall effect sensor is positioned proximate to the at least one spiraled conductive path and configured to sense the concentrated magnetic flux and provide a signal indication of the current flow through the at least one spiraled conductive path.

Another embodiment of the present invention includes a current sensor system. The current sensor system includes a conductor configured to receive a current flow and an anti-differential current sensor configured to monitor the current flow through the conductor. At least one flux concentrating recess is configured to receive the anti-differential current sensor.

A further embodiment of the present invention includes a method of making a flux concentrating current sensor system that includes configuring a conductive path to form a flux concentrating means to concentrate magnetic fields and disposing a pair of ferromagnetic-free current sensors in proximity to the flux concentrating means to detect the concentrated magnetic fields. The method also includes configuring an anti-differential calculator to receive feedback from the pair of ferromagnetic-free current sensors and generate an indication of current flow through the conductive path that is substantially free of errors due to magnetic fields generated externally from the conductive path impinging upon the pair ferromagnetic-free current sensors.

The present invention has been described in terms of the preferred embodiment, and it is recognized that equivalents, alternatives, and modifications, aside from those expressly stated, are possible and within the scope of the appending claims.

What is claimed is:

1. A current sensing system comprising:
a conductor configured to receive current flow therethrough and generate magnetic flux thereabout, at least a portion of the conductor configured as a helix shaped flux concentrator to concentrate magnetic flux induced by current flow through the conductor; and
an anti-differential current sensor configured to monitor magnetic flux about the conductor.

2. The current sensing system of claim 1 wherein the anti-differential current sensor includes at least two Hall effect sensors disposed proximate the conductor and a processing component configured to receive feedback from the at least two Hall effect sensors and generate an anti-differential output to substantially remove feedback generated responsive to magnetic flux induced externally from the conductor.

3. The current sensing system of claim 2 wherein the processing component includes at least one of a summing amplifier and a differential amplifier.

4. The current sensing system of claim 1 wherein the helix-shaped flux concentrator includes a spiral conductive path configured to receive the current flow from the conductor and wherein the anti-differential current sensor includes at least one magnetic flux sensor disposed proximate the at least one spiral conductive path to detect magnetic flux induced by the current flow through the conductive spiral path.

5. The current sensing system of claim 1 wherein the helix-shaped flux concentrator includes a first spiral conductive path having a first directional spiraling and a second spiral conductive path having a second directional spiraling and wherein the first directional spiraling and the second directional spiraling are substantially opposite in direction.

6. The current sensing system of claim 5 further comprising a first Hall effect sensor configured to monitor magnetic flux concentrated by the first spiral conductive path and a second Hall effect sensor configured to monitor magnetic flux concentrated by the second spiral conductive path.

7. The current sensing system of claim 6 wherein the first Hall effect sensor is configured to provide feedback indicating a magnitude and direction of current flow through the first spiral conductive path and the second Hall effect sensor is configured to provide feedback indicating a magnitude and direction of current flow through the second spiral conductive path.

8. The current sensing system of claim 7 further comprising a processing component configured to calculate one of a sum and a difference of the feedback from the first Hall effect sensor and the second Hall effect sensor to generate an indication of current flow through the first spiral conductive path and the second spiral conductive path.

9. The current sensing system of claim 1 wherein the conductor includes a wire.

10. The current sensor of claim 1 wherein the helix-shaped flux concentrator includes at least one flux concentrating recess disposed within the conductor and configured to concentrate magnetic flux about the at least one flux concentrating recess.

11. The current sensor of claim 10 wherein the anti-differential current sensor includes at least one Hall effect sensor configured to be disposed within the at least one flux concentrating recess.

12. The current sensor of claim 10 wherein the at least one flux concentrating recess includes two recesses oppositely disposed within the conductive path.

13. The current sensor of claim 10 wherein the conductive path includes at least one of a wire and a bus bar having a pair of flux concentrating recesses therein disposed on opposite sides thereof.

14. The current sensing system of claim 1 wherein the anti-differential current sensor and helix-shaped flux concentrator are substantially free of ferromagnetic flux concentrating materials and wherein the helix-shaped flux concentrator is arranged in one of a dual-helix and a quad-helix configuration.

15. The current sensing system of claim 1 wherein the helix-shaped flux concentrator includes a spiraled wire forming a portion of the conductor.

16. A current sensor comprising:
at least one spiraled-helix conductive path configured to receive a current flow therethrough and concentrate magnetic flux induced by the current flow through the at least one spiraled-helix conductive path;
at least one Hall effect sensor positioned proximate to the at least one spiraled-helix conductive path and configured to sense the concentrated magnetic flux and provide a signal indication of the current flow through the at least one spiraled-helix conductive path; and
wherein the at least one spiraled-helix conductive path includes a first spiraled conductive path having a first Hall effect sensor positioned proximate thereto and a second spiraled conductive path having a second Hall effect sensor positioned proximate thereto.

17. The current sensor of claim 16 wherein the at least one Hall effect sensor is configured to provide a determination of a magnitude and direction of current flow through the at least one spiraled-helix conductive path.

18. The current sensor of claim 16 wherein the first spiraled conductive path includes a first direction of spiraling and the second spiraled conductive path includes a second direction of spiraling and wherein the first direction of spiraling and the second direction of spiraling are substantially opposite in direction.

19. The current sensor of claim 16 further comprising a processor configured to receive magnitude and direction feedback from the first Hall effect sensor and the second Hall effect sensor and generate an anti-differential output from the magnitude and direction feedback to substantially offset magnitude and direction feedback not induced by the current flow through the at least one spiraled-helix conductive path.

20. The current sensor of claim 19 wherein the processor is configured to generate the anti-differential output by calculating one of a sum and a summed difference from the magnitude and direction feedback.

21. The current sensor of claim 16 wherein the first Hall effect sensor and the second Hall effect sensor are selected to reduce errors attributable to Hall gain drift and Lorentz force drifts.

22. The current sensor of claim 16 wherein the at least one Hall effect sensor and a second Hall effect sensor are disposed within the at least one spiraled-helix conductive path.

23. The current sensor of claim 16 wherein the current sensor is substantially free of ferromagnetic flux concentrating devices.

24. A current sensor system comprising:
a conductor configured to receive a current flow;
an anti-differential current sensor configured to monitor the current flow through the conductor; and
wherein the conductor is arranged according to a helix topology.

25. The current sensor system of claim 24 wherein the at least one flux concentrating recess includes opposing flux concentrating recesses and wherein the anti-differential current sensor includes Hall effect sensors disposed within the opposing flux concentrating recesses within the conductor.

26. The current sensor system of claim 25 wherein the matched Hall effect sensors are configured to provide feedback to a processing device and wherein the processing device is configured to generate an indication of current flow through the conductor that is substantially free of Hall effect specific errors.

27. The current sensor system of claim 26 further comprising an amplifier configured to generate at least one of a sum and a summed difference of the feedback to substantially cancel feedback generated by the matched Hall effect sensors in response to detecting magnetic flux induced externally from the conductor.

28. The current sensor system of claim 24 wherein the conductor includes a wire.

29. The current sensor system of claim 24 wherein the anti-differential current sensor is substantially free of ferromagnetic flux concentrating materials.

30. A method of making a flux concentrating current sensor system comprising:
configuring a conductive path to form a helix-shaped flux concentrating means to concentrate magnetic fields;
disposing a pair of ferromagnetic-free current sensors in proximity to the flux concentrating means to detect the concentrated magnetic fields; and
configuring an anti-differential calculator to receive feedback from the pair of ferromagnetic-free current sensors and generate an indication of current flow through the conductive path that is substantially free of errors due to magnetic fields generated externally from the conductive path impinging upon the pair ferromagnetic-free current sensors.

* * * * *